United States Patent [19]

Bendig

[11] Patent Number: 5,041,321
[45] Date of Patent: Aug. 20, 1991

[54] FIBERFORMED CERAMIC INSULATION AND METHOD

[75] Inventor: Anna L. Bendig, Seattle, Wash.

[73] Assignee: The Boeing Company, Seattle, Wash.

[21] Appl. No.: 698,496

[22] Filed: Feb. 5, 1985

Related U.S. Application Data

[63] Continuation-in-part of Ser. No. 667,568, Nov. 2, 1984, abandoned.

[51] Int. Cl.[5] ............................................. G32G 3/06
[52] U.S. Cl. ...................................... 428/102; 156/93;
156/296; 156/297; 156/298; 156/303.1;
264/109; 264/112; 264/131; 264/139; 264/135;
264/136; 162/152; 501/128
[58] Field of Search ............... 428/288, 367, 325, 102,
428/115, 114, 117, 118; 501/128; 162/152;
106/57; 264/109, 112, 131, 134, 135, 136;
156/296, 297, 298, 303.1, 9.3

[56] References Cited

U.S. PATENT DOCUMENTS

| | | | |
|---|---|---|---|
| 4,464,192 | 8/1984 | Layden et al. | 428/367 |
| 4,472,510 | 9/1984 | January | 501/128 |
| 4,564,556 | 1/1986 | Lange | 428/325 |

Primary Examiner—Stephen J. Lechert, Jr.
Attorney, Agent, or Firm—John C. Hammar

[57] ABSTRACT

Ceramic insulation has a mat of intersecting, discrete ceramic fibers bonded with a sol-gel glass binder. A fabric-reinforced glass coating is bonded to at least one surface of the mat. The insulation is prepared by forming a slurry of ceramic fibers, molding the slurry to form a soft felt mat, drying the mat, and incrementally introducing the binder into the mat with a multiple-impregnation technique, which controls shrinkage of the ceramic fiber mat. The fabric-reinforced glass coating is formed by applying a glass fiber cloth to a surface of the ceramic fiber mat and coating the same with a powdered glass. The powdered glass is melted and cooled.

The process provides a layering technique that permits formation of a continuous fibrous structure having layers that impart distinct characteristics at desired regions within the structure. By using different ceramic fibers and fibers of differing physical dimension, or by including additives with the slurries, tailoring of the physical characteristics of the insulation is achieved.

Improved properties are obtained by stitching the fiber cloth to the mat, curing the glass binder in a nitrogen atmosphere to replace oxygen in the glass with nitrogen, using a barrier coated cloth within the glass overcoat, or any combination thereof.

43 Claims, 1 Drawing Sheet

FIBERFORMED CERAMIC INSULATION AND METHOD

REFERENCE TO RELATED APPLICATIONS

This application is a continuation-in-part application based upon U.S. patent application Ser. No. 06/667,568, filed Nov. 2, 1984, now abandoned.

This application is also related to U.S. patent application Ser. No. 875,807 entitled: THERMAL INSULATION STRUCTURE, which is a continuation based upon U.S. Ser. No. 581,305, now abandoned.

TECHNICAL FIELD

This invention relates generally to fiberformed ceramic insulation and its method of manufacture.

BACKGROUND ART

In aerospace systems, such as engine exhaust ducts, nose cones, firewalls, and reentry shield surfaces, surfaces may be exposed to high temperatures or large temperature gradients and must, accordingly, be insulated. Each application has unique problems which have rendered it difficult to provide an adequate thermal insulation that can be tailored for optimum performance in each application.

Recently, low-density ceramic fibers have been used for insulating aerospace surfaces. For example, the space shuttle's exterior surface is insulated with a plurality of ceramic tiles that are arranged in a closely spaced, ordered array. To provide the required fit, each tile is cut precisely from a fused ceramic blank. To form the blanks, silica fibers and other ceramic components were initially mixed into a slurry and cast into blocks. After drying, the blocks were sintered to form strong ceramic bonds between the overlapping fibers. The blocks were cut into smaller blanks that were subsequently milled into the final tiles. Each tile was bonded to an isolation pad with a high-temperature adhesive. The pad was, then, bonded to the underlying metallic substructure of the shuttle.

During takeoff and reentry, a diff surface temperature distribution exists over the surface of the space shuttle. The fused ceramic tiles are vulnerable to shear forces caused by the differential surface temperature ion. To prevent breakage, each tile must be small (generally less than ten inches on a side) thereby creating enormous fabrication and assembly costs.

Glass coatings have been developed to improve thermal shock resistance for ceramics. U.S. Pat. No. 4,093,771 to Goldstein et al. discloses a borosilicate glass coating that is used on the surface of reusable silica insulation. U.S. Pat. No. 4,381,333 to Stewart et al. discloses a two-layer glass coating for silica insulation. The base layer has a high emittance and is preferably formed by combining a reactive borosilicate glass with an emittance agent, such as silicon tetraboride, silicon hexaboride, boron, or silicon carbide. The outer layer is formed from discrete, sintered glass particles to provide a high scattering coefficient. Preferably, fused silica or a reactive borosilicate for the outer layer. In either the Goldstein or Stewart patent, the coating is sprayed onto the underlying fiber ion before firing to form a glass.

Insulation may be formed with an unsolidified silica glass felt sandwiched between silica glass fiber. The three layers are stitched together with silica glass thread (or another suitable refractory thread) and are bonded with adhesive to the surface to be protected. Similarly, a layering effect may be achieved by superposing a stitched blanket of silica and aluminoborosilicate fibers. (commercially available under the trademark NEXTEL from 3M Company) over a separate, stitched blanket of silica fibers. By staggering the blankets and using suitable emittance coatings on the outer surfaces of the blankets, control of the insulative characteristics can be achieved, thereby countering the temperature distribution on and gradient through the insulation.

Lightweight fibrous insulation that permits a wide range of design choices in terms of insulative characteristics, strength, and durability is still needed.

SUMMARY OF THE INVENTION

Fiberformed ceramic insulation with surprising physical properties is made by forming a slurry of ceramic fibers, molding the slurry to form a soft felt mat, drying the mat, and incrementally introducing a sol-gel glass binder into the mat to form a rigid mat. The incremental addition of the sol-gel binder is accomplished through a unique multiple impregnation technique in which a small amount of binder is initially impregnated into the mat is gelled, and is cured to stabilize the mat dimensionally, allowing handling and further processing of the mat. The mat is strengthened thereafter to its final form by successive additions of glass binder. This technique cures the mat to a rigid, predetermined shape without appreciably shrinking of the resultant structure, and is contrasted with prior processes in which the entire binder is introduced either in one impregnation of the mat or by incorporating the binder in the fiber-containing slurry prior to the molding or felting operation. U.S. Pat. No. 3,702,279 to Ardary et al and U.S. Pat. No. 3,935,060 to Blome et al. exemplify these prior processes.

By forming a plurality of slurries containing different ceramic fibers, and molding each of the slurries in succession to form a single felt mat having interlocking layers of fibers, the thermal and mechanical characteristics of the resulting insulation can be controlled over a wide range. By using longer fibers, the insulation can be strengthened where desired, as for example, in the region that is joined to the skin or substructure. Where a particular application requires further resistance to high temperatures or to large temperature gradients, a layer of high emittance can be formed at desired locations within the continuous fiber mat by including an emittance agent, such as boron or silicon carbide, in one or more slurry. A desired insulative profile can also be obtained by using ceramic fibers of different materials in the different slurries, thereby countering the effect of the temperature distribution on the surface. With these controllable variables and others, insulation can be made for a wide range of applications.

The insulation can be formed with a coating on one or more of its surfaces, preferably by bonding a glass fiber cloth to the surface, adding powdered glass to the cloth, melting the powder, and solidifying the melt. The glass coating provides impact resistance.

A vacuum-felting process tends to align the ceramic fibers parallel to the forming surface, producing an anisotropic material having reduced flatwise tensile strength. This anisotropic material can be mechanically strengthened by stitching the mat with glass or other high-temperature refractory thread in a direction that is normal or at angles to the mat fibers. If the mat has layers, the stitching provides additional connection between the layers. Stitching can also be used to anchor the glass fabric of the coating to the mat.

Preferred insulation comprises a mat of intersecting ceramic fibers, which are held together by sol-gel glass bonds, and a fabric-reinforced glass coating on at least one surface of the mat. This insulation usually includes a network of ceramic fibers that are disposed in a plurality of layers, with fibers within each layer intersecting other fibers within the same layer. Some fibers within each layer intersect fibers in adjacent layers. To strengthen the layered network, sol-gel glass bonds are formed where the ceramic fibers intersect.

DETAILED DESCRIPTION OF THE INVENTION

Figure 1:
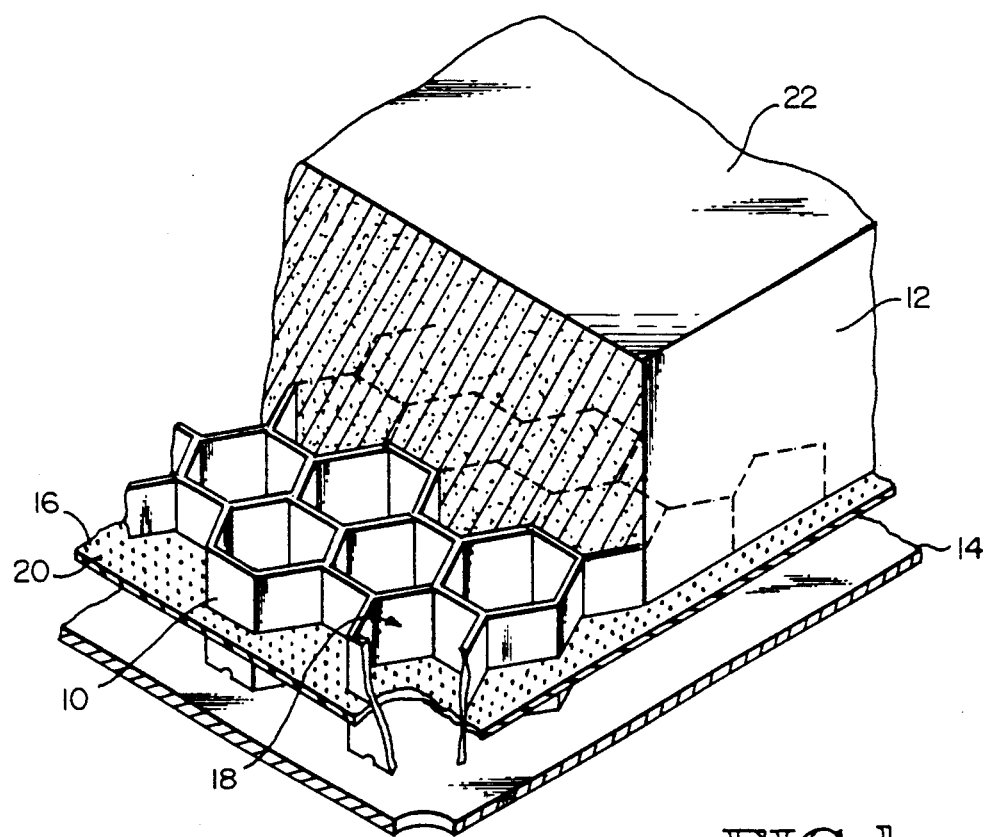
FIG. 1 is an isometric of preferred ceramic insulation of the present invention.

Ceramic insulation must be resistant to at least three heat transfer regimes. First, it must be able to withstand high absolute temperatures which are caused by friction during take-off and reentry. Second, it must be able to resist large temperature gradients across the insulation caused by a large temperature difference between the interior of the vessel and the environment. Here, the environment either may be hot (sun-side) or cold (shadow). Third, the insulation must be able to withstand large temperature gradients at different portions of the surface since one portion may be hot while another nearby portion may be cold. The insulation of the present invention fulfills these general goals.

A mat of discrete ceramic fibers that selectively intersect one another in a semi-random fashion is bonded with a sol-gel glass binder that forms bonds between the fibers at their intersections. A glass coating (having a glass fiber cloth reinforcement) is bonded on at least one surface of the mat to provide impact resistance. This insulation may be formed in a variety of shapes including flat structures, hollow cylinders, and frustums. The insulation may be bonded directly to the surface to be protected or may be formed on a substrate that is subsequently attached to the surface. Similar to the insulation described in U.S. patent application Ser. No. 581,305, filed Feb. 17, 1984, a honeycomb core 10 (FIG. 1) may be used to position a layer of the insulation 12 in spaced relation to an underlying surface 14 to provide thermal protection for the surface 14 through enhanced conductive and convective thermal resistance. A septum 16 within the core 10 divides each cell 18 into inner and outer cavities. The ceramic insulation 12 fills only the outer cavities. This arrangement is preferably achieved by vacuum casting the insulation 12 into the outer cavities of the honeycomb core 10 by drawing a vacuum through perforations 20 in the septum 16 to draw at least one slurry of the fibers into the outer cavities of the cells 18. The fibers are then bonded together to form the ceramic insulation 12. An impact-resistance coating 22 completes this honeycomb insulation.

With a sol-gel glass binder in a ceramic fiber mat, gelling of the binder at the junctions of the intersecting fibers ordinarily shrinks the mat. Some degree of shrinkage can be tolerated where the formed insulation mat is machined into the final configuration, as in prior art processes. Where the ceramic fiber is to be formed in situ, such as in honeycomb, however, shrinkage is more critical and, often, cannot be tolerated. The multiple impregnation technique of the present invention controls the shrinkage of the ceramic fiber mat and is optimally suited for use where such control is essential.

An aqueous slurry of ceramic fibers is thoroughly mixed to provide a substantially uniform dispersion of the fibers. The slurry generally comprises from about 0.2–0.5 weight percent alumino-silicate fibers and from about 99.5–99.8 weight percent water, but other fibers of silica, alumina, mullite (commercially available under the trademark ULTRAFIBER 440 from 3M Company), zirconia, silicon nitride, or mixtures thereof may be used at different concentrations, as desired. It may be desirable to use fibers of different materials to tailor the insulative characteristics or density of the insulation. For instance, a mat having distinct layers of alumina and aluminosilicate fibers would be useful at higher temperatures. Fibers of mullite or of an alumina-zirconia mixture would reduce the density of the resulting insulation without substantially affecting the temperature limit for the insulation.

The length and diameter of the fibers effects the characteristics of the insulation. Generally, the length of the fibers should be between about one-sixteenth and four inches, while the diameter of the fibers should range between about one and three microns. Shorter fibers can be used with conventional cellulose fiber-felting aids. The preferred fibers are about one-quarter inch in length and about one micron in diameter. Longer fibers produce an insulation of increased strength.

The binder is preferably an alumina sol-gel glass that can be prepared using conventional techniques. Other sol-gel glasses may be used. For example, a silica sol-gel glass or a sol-gel glass of similar composition to the particular fiber in the mat may be used, if desired.

After the slurry has been thoroughly mixed, it is pulled by vacuum through a filtered mold to form a soft felt mat on the mold Through selection of the mold, the felt mat can be formed in a variety of shapes, including those with irregular, curved surfaces and those with open interiors, such as hollow cylinders and frustums.

The soft felt mat, usually without the mold, is heated to a temperature of about 200° F. to remove all water from the mat. The best green strength for the dried mat is obtained when the majority of fibers are about one-quarter inch in length and about one micron in diameter. The duration of drying will, of course, depend upon the size and shape of the mat.

Once the mat has been dried, a sol-gel glass binder is introduced in incremental stages. This incremental addition of binder limits shrinkage of the mat and assures good distribution of the binder throughout the mat. Surprisingly higher densities and greater strength for the insulation results. Incremental addition of the binder involves repeating the steps of impregnating the mat with binder, gelling the binder, and curing the mat and binder. Preferably, a light coating of binder is applied in the first stage with an air-dry gellation to stabilize the fiber mat dimensionally. Thereafter, the steps of impregnating, gelling, and curing are repeated one or more times until the total binder is added. The density and strength of the resulting insulation can be controlled with this multiple binder impregnation technique. Because the configuration of the molded fiber mat is precisely maintained, the process is particularly suited to applications where shrinkage of the mat is a prime concern. Precise parts in varied shapes are achievable without further machining.

The impregnating step may be accomplished by wicking, spraying, or vacuum infiltrating. Spraying is preferred.

After impregnation, the binder is converted to a rigid gel, usually by air drying or by subjecting the binder-impregnated mat to an atmosphere of ammonia gas. Since the ammonia sol reaction is exothermic, there is a tendency for bubbles to form in the mat if ammonia is used. This problem is avoided, however, by allowing the first binder to gel in air. Thereafter trapped bubbles are not a problem, and ammonia gellation can be used.

After gelling the binder, the mat is cured, first, by heating the mat to about 200° F. for about four hours, then, by slowly increasing the temperature to about 600° F. over a five-hour period, and, finally, by rapidly reducing the temperature (quenching).

A glass coating including an integral glass fiber cloth may be bonded to the mat on at least one surface for impact protection. The sol-saturated fiber cloth is placed on the surface of the lightly wetted mat. Thereafter, powdered glass is applied to the exposed surface of the fiber cloth by brushing an aqueous slurry of the powdered glass onto the cloth or by other conventional means. The mat and cloth are then placed on a heated oven which dries the powdered glass and then melts the glass to allow it to flow around and between the fibers in the glass fabric and into contact with the underlying mat. Usually, the mat and cloth are placed in a 2000° F. oven for about five minutes, although the conditions vary for the various applications. The liquefied placing the glass fiber cloth for the impact coating in the vacuum mold used for forming and shaping the ceramic fiber mat so that the ceramic fibers will interlock with the pores of the cloth. Since the cloth is porous, it will not significantly impede passage of the sol-gel binder into the mat. Thus, the incremental process steps to add the binder can be followed, and the resulting insulation can have the glass fiber cloth reinforcement directly on the mat.

The mechanical strength of the insulation is enhanced by stitching the fiber mat with a suitable refractory thread. Since the vacuum-forming procedure tends to align the ceramic fibers parallel to the forming surface, the threads can be sewn in a pattern which orients the stitches in a predetermined direction to the fiber orientation. To further strengthen the insulation, the glass fiber cloth of the coating may be stitched to the mat, with the stitching preferably being done after initial addition and curing of the sol-gel glass binder so that the mat is dimensionally stabilized.

In prior fiberformed ceramic insulation where a binder was used to hold the fibers together, the resultant structure was substantially homogeneous throughout. To improve the physical, thermal, and optical properties of these prior art insulations structures, it has been necessary to apply glass coatings to the outer surface of the insulation. For example, U.S. Pat. Nos. 4,381,333 and 4,093,771 use additives to increase the emittance of these glass coatings. While these coatings exhibit satisfactory performance, it would be advantageous if control over the thermal, mechanical, and other characteristics of the insulation could be provided within the fibrous ceramic mat itself rather than only in an overlay coating. The insulation of the present invention glass cools and solidifies to produce a smooth surface coating providing strong attachment o the glass fabric to the mat. Better results are achieved if the liquefied glass is rapidly cooled (quenched) in flowing air, rather than slowly cooled. Glasses with high thermal shock-resistance, such as borosilicate glasses, are best suited for this approach.

To form the impact-resistive coating, a aluminoborosilicate glass fiber cloth (NEXTEL), having a boron nitride barrier coating in the manner of Simpson and Verzemnieks, is preferably used in conjunction with a powdered borosilicate glass (PYREX). According to the method of Simpson and Verzemnieks, the barrier coated glass cloth preferably is formed by heating the cloth in a nitriding atmosphere, including ammonia, at a temperature of between about 2200° F.–2500° F. for about 5–90 minutes or longer. Hydrogen and nitrogen may be added to dilute the ammonia. Preferably, the flowing atmosphere has about 11% $H_2$, 5% $NH_3$, and 84% $N_2$ by volume. Boron nitride forms as a barrier coating on the NEXTEL fiber. When incorporated into the glass coating, the resulting composite has superior impact resistance and strength. The barrier coating provides incomplete bonding of the glass to the cloth so that the composite can better absorb the energy of growing cracks, thereby stopping their growth.

Other glass fabrics and powdered glasses, preferably thermal shock-resistant glasses, may be used, the selection being determined by the particular application for the insulation. Coating the fiber mat should be accomplished without fusing the individual fibers in the fabric. While a sol-gel reaction may be used for binding the fabric, the powdered glass technique is preferred.

The fiberformed insulation can be made by initially satisfies this aim by including a layering technique, which permits formation of a continuous fiber structure having layers that impart distinct characteristics at desired regions within the structure. Slurries of different characteristics are applied at the desired locations to produce a felt mat having interlocking layers. The types of fibers, the physical dimensions of the fibers, the number of layers, and the slurry additives can be varied to achieve a continuous mat having the desired distribution of properties.

Improved properties can be obtained by curing the sol-gel binder in an ammonia or other nitrogen-containing gas atmosphere so that nitrogen replaces oxygen in the glass structure. Such a substitution results in enhanced fracture toughness, microhardness, refractoriness, and chemical durability. The method of nitrogen replacement is particularly beneficial when the mat includes additives for emission or conductance which are oxygen sensitive. The nitrogen atmosphere can protect these additives so that higher processing temperatures can be used. As explained by Brinker and Haaland for oxynitride glasses (J. of Am. Ceramic S., vol. 66, No. 11, p.758–765), nitrogen can interact with oxygen in the glass through hydrogen bonding, can interact with metals in the glass through Lewis acid adsorption, and can replace oxygen entirely through well-known chemical reactions at the surface. In this way, the 3-fold coordination of nitrogen can be introduced into the glass matrix to replace the 2-fold coordination of oxygen, and improves the glass. Nitrogen serves as a crosslinking agent which should increase the glass transition temperature. The microhardness should be increased as well as the sintering temperature, and the thermal expansion characteristics will probably be altered.

The following Examples illustrate preferred features of the invention.

EXAMPLE I

A fiber slurry of 60 gallons of water and 300 grams aluminosilicate fibers approximately 0.25 inches in length and one micron in diameter was mixed by circulating the components for 30 minutes through a polyethylene-lined, air-operated, double-diaphragm pump into a 90-gallon polyethylene tank. A filter mold was attached to the pump, and 30 gallons of slurry (about ½ the volume) were pulled through the mold, depositing about 150 grams of fiber in a soft mat on the surface of the mold The mat was removed from the mold and was dried in a circulating-air oven at about 200° F. until all the water was removed.

An alumina sol-gel binder comprising about 459 grams of aluminum isopropoxide, 4053 grams of distilled water, and 18 grams of hydrochloric acid was refluxed at a controlled temperature for three days, and was, then, distilled to a solution containing seven grams of alumina per 100 cc.

The resulting sol was wicked into the dried fiber mat until the entire mat was saturated. To convert the sol to a gel, the saturated mat was placed in a sealed nylon bag with a small outlet tube that was connected to a bottle of ammonia gas. The bag was inflated with gas at a flow rate designed to keep the bag fully expanded. After one hour, the gas was turned off and the bag was opened, allowing the excess gas to escape. The fully gelled mat was removed from the bag, and cured for four hours in an air-circulating oven at about 200° F. After this initial four-hour period, the temperature was slowly increased to 600° F. over a five-hour period, before the temperature was rapidly lowered to 200° F. and maintained at 200° F. for two more hours. The resulting rigid mat had a density of 16 lb/ft$^3$ and a flexural strength of 200 psi.

A sheet of NEXTEL glass fiber cloth was cut to the size of the mat. The surface of the rigid mat was lightly wetted with the alumina sol-gel binder. The cloth, saturated with this binder, was placed on the surface of the mat. A slurry containing 100 grams of −325 mesh borosilicate glass powder and 50 grams distilled water was then brushed onto the cloth. The resulting composite assembly was then heated in an air-circulating oven at 200° F. until dried. The dried assembly was then heated for five minutes at 2000° F. to melt the borosilicate glass, before being removed from the oven to cool and solidify the glass.

EXAMPLE II

The process of Example I was followed to form a rigid mat, except that, after the fully gelled mat was cured, the impregnating, gelling, and curing steps were repeated by (1) resaturating the mat in two successive applications with the alumina sol binder, (2) exposing the saturated mat to ammonia gas for one hour, and (3) then, heating the mat with the same temperature regime as Example I to cure the second addition of binder. The mat had a density of 22 pounds/cubic foot and a flexural strength of 1200 psi, showing the surprising results achieved through incremental binding method of the present invention. The flexural strength increased sixfold by the incremental binding technique.

EXAMPLE II

Four slurries were prepared in the manner described in Example I. Slurry A had no additional ingredients. Slurries B, C, and D included about the following amounts of silicon carbide fibers (an emittance agent): 0.5 g for slurry B; 1.0 g for slurry C; and 3.0 g for slurry D. These four slurries were then molded into a soft felt mat using a filter mold attached to the pump. A first layer was laid down on the mold using 30 gallons of slurry A, depositing a 150-gram soft mat on the mold surface. Successive layers from slurries B, C, and D were deposited on the underlying layers The resulting mat had a total eight of about 600 grams. This mat was then processed in an identical fashion to Example 1, but without the addition of the glass coating. Through proper molding, different areas of the slurries could be coated at desired locations in the mat.

EXAMPLE IV

A cylindrical filter mold was used to form insulation from a slurry prepared in the same manner as the slurry of Example I. An open cylindrical soft fiber mat 2¼ inch by 3 inch by 3-inch height was formed and subsequently processed with three incremental additions of binder in the same manner described in Example II. A glass coating having a fiber cloth reinforcement was applied to the inner surface of the rigid mat following the procedure described in Example I.

EXAMPLE V

A slurry was prepared according to the method of Example I, and contained 750 g of zirconia fiber and 40 g of microcellulose fiber (a felting aid). Following the method of Example I, insulation was prepared, using three impregnations of alumina sol-gel binder The product had a density of 36 lb/ft$^3$ and a flexural strength of about 314 psi.

EXAMPLE VI

A slurry was prepared according to the method of Example I, and contained a sufficient amount of ULTRAFIBER 440, a mullite fiber available from 3M Co. After rigidifying in accordance with the method of Example I, using three impregnations of alumina sol-gel, the product had a density of about 19 lb/ft$^3$.

Those skilled in the art will understand that the present invention provides a highly flexible approach to the formation of lightweight insulating structures that are suitable for use at high temperatures and with large temperature gradients. Since the multiple binder impregnation approach controls shrinkage during the forming process, the invention provides a means for precisely forming ceramic insulation. The product can a variety of configurations. Those skilled in the art will also understand that other ceramic fibers, sol-gel binders, and emittance agents may be used in the process of the present invention. For example, silica, zirconia, mullite, or aluminosilicate chromia fibers or mixtures of fibers may be used. Any inorganic material that can be converted from a sol to a glass may be used as the binder.

Other embodiments of the invention will also be apparent to those skilled in the art from a consideration of this specification. The specification and examples are illustrative only, and the true scope and spirit of the invention is indicated by the claims. Therefore, the invention should be limited only as is necessary by construing the claims in light of this description and the pertinent prior art.

I claim:

1. A process for forming a fibrous ceramic insulation having improved strength and density, comprising the steps of:

(a) forming at least one slurry of ceramic fibers;
(b) molding the slurry to form a soft felt mat having intersecting ceramic fibers;
(c) drying the soft felt mat;
(d) impregnating the mat with a portion of a sol-gel binder;
(e) gelling the binder to form bonds at the intersections of the ceramic fibers so that the mat is dimensionally stabilized;
(f) curing the gelled binder; and
(g) repeating each of steps d, e, and f at least once to complete the insulation.

2. The process of claim 1, further comprising the step of bonding a glass coating, including an integral glass fiber cloth reinforcement, on at least one surface of the insulation.

3. The process of claim 2, wherein the glass coating is formed by:
(a) applying a glass fiber cloth to the surface of the insulation;
(b) applying a powdered glass to the glass fiber cloth;
(c) heating the insulation to melt the powdered glass; and
(d) cooling the insulation to bond the glass and glass fiber cloth to the insulation.

4. The process of claim 3, wherein the powdered glass is applied by coating the glass fiber cloth with a slurry containing the powdered glass.

5. The process of claim 3, further including the step of stitching the glass fiber cloth to the insulation prior to bonding the cloth to the insulation.

6. The process of claim 2, wherein the glass coating is formed by:
(a) applying a glass fiber cloth to at least one surface of the mat after the initial steps of impregnating, gelling, and curing but before repeating these steps to form the insulation;
(b) stitching the glass fiber cloth to the dimensionally established mat;
(c) thereafter repeating each of step d, e, and f of claim 1 at least once;
(d) applying powdered glass to the glass fiber cloth;
(e) melting the powdered glass; and
(f) cooling the glass to bond the glass fiber cloth to the mat.

7. A process for forming an insulation material, comprising the steps of:
(a) placing a glass fiber cloth in a vacuum mold;
(b) molding a slurry containing ceramic fibers over the cloth in the mold to form a soft felt mat having intersecting ceramic fibers;
(c) drying the mat;
(d) impregnating the soft felt mat with a portion of a sol-gel glass binder so that the mat is dimensionally stable;
(e) gelling the binder to form bonds at the intersections of the ceramic fibers;
(f) curing the gelled binder;
(g) repeating each of steps d, e, and f at least once to form a rigid mat;
(h) applying powdered glass to the glass fiber cloth on one side of the mat;
(i) heating the mat to melt the powdered glass;
(j) cooling the mat to solidify the glass and to bond the cloth to the mat to complete the insulation.

8. The process of claim 7, further including the step of stitching the glass fiber cloth to the dry mat before step d.

9. The process of claim 7, further including the step of stitching the glass fiber cloth to the mat after step f and before step g.

10. Insulation, comprising:
(a) a mat of ceramic fibers, some of said fibers intersecting one another;
(b) sol-gel glass bonds where the fibers intersect; and
(c) a glass coating bonded to at least one surface of the mat.

11. The insulation of claim 10, wherein the glass coating includes a glass fiber cloth reinforcement.

12. The insulation of claim 11, wherein the glass fiber cloth is stitched to the mat with refractory thread.

13. A process for forming insulation, comprising the (a) forming a plurality of slurries containing
(a) forming a plurality of slurries containing ceramic fibers;
(b) molding each slurry in succession to form a soft felt mat having interlocking layers of ceramic fibers from the respective slurries, some ceramic fibers within each layer intersecting one another;
(c) drying the mat;
(d) impregnating the dry mat with a portion of a sol-gel glass binder so that the mat is dimensionally stable upon curing of the binder;
(e) gelling the binder to form bonds at the intersection of ceramic fibers;
(f) curing the gelled binder; and
(g) repeating each of steps d, e, and f at least once to strengthen the mat into the desired insulation.

14. The process of claim 13, wherein at least one slurry contains ceramic fibers that are different from the fibers of at least one other slurry.

15. The process of claim 13, wherein the slurries contain ceramic fibers of the same material, and wherein at least one slurry contains ceramic fibers of a different length from the ceramic fibers of at least one other slurry.

16. The process of claim 13, wherein at least one slurry contains an emittance agent.

17. Insulation, comprising:
(a) a mat of ceramic fibers, the fibers being disposed in a plurality of layers, some ceramic fibers within each layer intersecting other fibers within the same layer, some fibers within each layer intersecting fibers in an adjacent layer;
(b) sol-gel glass bonds at the intersection of the ceramic fibers; and
(c) a glass coating on at least one surface of 18. The insulation of claim 17, wherein the glass coating includes a glass fiber cloth bonded to the mat within a layer of glass.

19. The insulation of claim 18, wherein at least one layer contains ceramic fibers that are different from the ceramic fibers of at least one other layer.

20. The insulation of claim 18, wherein the ceramic fibers of all layers are the same material, but wherein the fibers of at least one layer are a different length from the fibers of at least one other layer.

21. The insulation of claim 18, wherein at least one layer includes an emittance agent.

22. The product of the process of claim 1.
23. The product of the process of claim 7.
24. The product of the process of claim 13.
25. The product of claim 23 wherein the glass fiber cloth includes a boron nitride barrier coating and wherein the cloth is made from aluminoborosilicate fibers.

26. The product of claim 25 wherein the ceramic fibers in the mat are selected from the group consisting of aluminosilicate, zirconia, and mullite fibers, wherein the binder is an alumina sol-gel, and wherein the powdered glass includes borosilicate.

27. The product of claim 26 wherein the ceramic fibers are between about 1/16 to 4 inch long and between about 1–3 microns in diameter.

28. Insulation, resistant to high temperatures and large temperature gradients, comprising:
   a mat of ceramic fibers formed by curing in air a felted body of fibers with a portion of a sol-gel binder and then strengthening the body with repeated applications and curings of 29. The insulation of claim 28, further comprising a reinforcing glass layer bonded to at least one surface of the mat.

30. The insulation of claim 29, wherein the glass layer includes glass fiber cloth reinforcement.

31. The insulation of claim 30, wherein the cloth is stitched to the mat with suitable refractory thread.

32. The insulation of claim 30, wherein the mat is non-homogeneous because the mat includes different ceramic fibers within selected portions of the mat.

33. The insulation of claim 30, wherein the mat includes a body having at least two layers of ceramic fibers laid up prior to binding the felted body with the sol-gel binder.

34. Insulation, resistant to high temperatures and large temperature gradients, comprising:
   (a) a mat of aluminosilicate fibers having a length between about 1/16–4.0 in and a diameter between about
   (b) an alumina sol-gel binder applied to and cured with the fibers in at least two steps, a first step, in air, to stabilize the mat dimensionally and a second step, in air or ammonia, to strengthen the mat;
   (c) a glass coating of borosilicate glass bonded to at least one surface of the mat; and
   (d) an aluminoborosilicate glass fiber cloth, having a boron nitride coating, within the glass layer as a reinforcement.

35. The insulation of claim 34 further comprising refractory thread stitching between the mat and the glass fiber 36. A process for forming a ceramic insulation having improved strength and density, comprising the steps of:
   (a) forming at least one slurry of ceramic fibers;
   (b) molding the slurry to form a soft felt mat having intersecting ceramic fibers;
   (c) drying the soft felt mat;
   (d) impregnating the mat with a portion of a sol-gel glass binder;
   (e) gelling the first portion of binder to form bonds at the intersections of the ceramic fibers so that the mat is dimensionally stabilized;
   (f) curing the gelled binder;
   (g) impregnating the stabilized mat at least once with another portion of a sol-gel glass binder;
   (h) gelling each added portion; and
   (i) curing the added binder, after the series of impregnating and gelling steps, in a nitrogen-containing atmosphere to exchange nitrogen for oxygen in the cured binder to form the ceramic insulation.

37. The process of claim 36 further comprising the steps of:
   (a) applying a glass fiber cloth to at least one surface of the insulation;
   (b) applying a powdered glass to the glass fiber
   (c) heating the insulation to melt the powdered
   (d) quenching the melt in air to solidify the 38. The process of claim 37 wherein steps of gelling and curing the first portion of binder occur in an oxygen atmosphere to avoid formation of bubbles in the stabilizing binder 39. The product of the process of claim 36.

40. The product of the process of claim 38.

41. The product of claim 40 wherein at least some fibers are aluminosilicate fibers having a length between about 1/16–4.0 in and diameter of between 1–3 microns, the binder includes an alumina sol-gel, the glass coating includes borosilicate glass, and the glass fiber cloth includes aluminoborosilicate.

42. The product of claim 41 wherein the glass fiber cloth includes a boron nitride barrier coating.

43. Insulation, resistant to high temperatures and large temperature gradients, comprising:
   (a) a honeycomb core having a perforated septum dividing honeycomb cells into inner and outer cavities;
   (b) ceramic insulation in the outer cavities of the core, the insulation including at least one layer of a mat of ceramic fibers having intersecting fibers bonded together with a sol-gel glass binder applied in an incremental process to improve the strength and density of the insulation while maintaining the dimensions of the mat; and
   (c) a glass coating on the outer surface of the mat, the coating including a glass fiber cloth reinforcement.

* * * * *